United States Patent
Liu et al.

(10) Patent No.: US 10,503,947 B2
(45) Date of Patent: Dec. 10, 2019

(54) TOUCH PANEL AND DISPLAY APPARATUS

(71) Applicant: BOE TECHNOLOGY GROUP CO., LTD., Beijing (CN)

(72) Inventors: Yingming Liu, Beijing (CN); Xue Dong, Beijing (CN); Jing Lv, Beijing (CN); Haisheng Wang, Beijing (CN); Chunwei Wu, Beijing (CN); Xiaoliang Ding, Beijing (CN); Rui Xu, Beijing (CN); Lijun Zhao, Beijing (CN); Changfeng Li, Beijing (CN); Yanan Jia, Beijing (CN); Yuzhen Guo, Beijing (CN); Yunke Qin, Beijing (CN); Pinchao Gu, Beijing (CN); Fanna Meng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 148 days.

(21) Appl. No.: 15/743,583

(22) PCT Filed: Jul. 7, 2017

(86) PCT No.: PCT/CN2017/092212
§ 371 (c)(1),
(2) Date: Jan. 11, 2018

(87) PCT Pub. No.: WO2018/059060
PCT Pub. Date: Apr. 5, 2018

(65) Prior Publication Data
US 2019/0156097 A1    May 23, 2019

(30) Foreign Application Priority Data
Sep. 30, 2016 (CN) .......................... 2016 1 0874200

(51) Int. Cl.
*G06K 9/00* (2006.01)
*G06F 3/041* (2006.01)
(Continued)

(52) U.S. Cl.
CPC ....... *G06K 9/00013* (2013.01); *G06F 3/0412* (2013.01); *G06F 3/0421* (2013.01);
(Continued)

(58) Field of Classification Search
CPC ............. G06K 9/0004; G06K 9/00013; G06K 2009/0006; G06K 9/0008; H01L 27/323; G06F 3/0412; G06F 3/0421
See application file for complete search history.

(56) References Cited

U.S. PATENT DOCUMENTS 9,659,969 B2 * 5/2017 Yamazaki ........... H01L 27/1225
9,935,202 B2 * 4/2018 Yamazaki ........... H01L 27/1225
(Continued)

FOREIGN PATENT DOCUMENTS

CN   103942537 A   7/2014
CN   104779267 A   7/2015
(Continued)

OTHER PUBLICATIONS

Chinese office action dated May 10, 2017 for corresponding CN application 201610874200.9 with English translation attached.
(Continued)

*Primary Examiner* — Utpal D Shah
(74) *Attorney, Agent, or Firm* — Nath, Goldberg & Meyer; Joshua B. Goldberg

(57) ABSTRACT

There is provided a touch panel comprising an array substrate and a fingerprint identification substrate. The array substrate comprises a first base and pixel units provided on the first base, each pixel unit comprises a thin film transistor and an organic light emitting diode, the fingerprint identi-
(Continued)

fication substrate comprises a second base and fingerprint identification devices provided on the second base, the fingerprint identification substrate is located at a side of the first base distal to the pixel units, the array substrate further comprises a light blocking layer and a via-hole, the via-hole is formed in the light blocking layer so that light emitted by the organic light emitting diode is reflected by a surface of a touch terminal, the surface of the touch terminal comprises ridges and valleys, light reflected by the ridges and the valleys passes through the via-hole to irradiate onto different fingerprint identification devices respectively.

11 Claims, 3 Drawing Sheets

(51) Int. Cl.
    *G06F 3/042* (2006.01)
    *H01L 27/32* (2006.01)

(52) U.S. Cl.
    CPC ......... *G06K 9/0004* (2013.01); *G06K 9/0008* (2013.01); *H01L 27/323* (2013.01); *G06K 2009/0006* (2013.01)

(56) References Cited

U.S. PATENT DOCUMENTS

| | | | | |
|---|---|---|---|---|
| 2010/0110041 A1* | 5/2010 | Jang | ..................... | G06F 3/0412 345/174 |
| 2015/0162389 A1* | 6/2015 | Zhang | ................. | H01L 51/5206 257/40 |
| 2015/0331508 A1 | 11/2015 | Nho et al. | | |
| 2016/0077640 A1* | 3/2016 | Brinkley | ............. | G02F 1/13338 345/173 |
| 2017/0220844 A1* | 8/2017 | Jones | ................... | G06K 9/0053 |
| 2017/0316248 A1* | 11/2017 | He | ..................... | G06K 9/00006 |
| 2018/0012069 A1* | 1/2018 | Chung | ................. | A61B 5/1172 |
| 2018/0119269 A1* | 5/2018 | Mizuno | ................. | C23C 14/042 |
| 2018/0203554 A1* | 7/2018 | Cho | ...................... | G06F 3/0412 |
| 2019/0019850 A1* | 1/2019 | Xu | ....................... | G06K 9/0004 |
| 2019/0026523 A1* | 1/2019 | Shen | ................... | G06K 9/0004 |

FOREIGN PATENT DOCUMENTS

| | | |
|---|---|---|
| CN | 105095877 A | 11/2015 |
| CN | 105678255 A | 6/2016 |
| CN | 105760808 A | 7/2016 |
| CN | 106298859 A | 1/2017 |
| CN | 206179868 U | 5/2017 |

OTHER PUBLICATIONS

Chinese office action dated Aug. 18, 2017 for corresponding CN application 201610874200.9.
Chinese office action dated Dec. 14, 2017 for corresponding CN application 201610874200.9.
International search report dated Sep. 28, 2017 for corresponding application PCT/CN2017/092212 with English translation attached.

* cited by examiner

TOUCH PANEL AND DISPLAY APPARATUS

This is a National Phase Application filed under 35 U.S.C. 371 as a national stage of PCT/CN2017/092212, filed Jul. 7, 2017, an application claiming the benefit of Chinese Application No. 201610874200.9, filed Sep. 30, 2016, the content of each of which is hereby incorporated by reference in its entirety.

FIELD

The present application relates to the field of display technology, and particularly to a touch panel and a display apparatus.

BACKGROUND

Fingerprints are inborn and invariable characteristics of a human body, and are unique to everyone and can be used to distinguish from others. Each fingerprint comprises a series of ridges and valleys at skin surface of fingertip, and the ridges and the valleys generally include details of ridge bifurcation, ridge ending, arch (e.g. tented arch), left loop, right loop, whorl or twin loop, etc., these details determine uniqueness of fingerprint. Fingerprint identification technology is developed due to the uniqueness of fingerprint, and is an earlier technology that has been used for personal identity authentication. Optical imaging, thermal sensor, human body infrared sensor and so on are widely used for fingerprint acquisition and input.

SUMMARY

The present application provides a touch panel and a display apparatus, which have a fingerprint identification function and can identify fingerprints accurately.

One technical solution of the present application is a touch panel comprising an array substrate and a fingerprint identification substrate, wherein the array substrate comprises a first base and a plurality of pixel units provided on the first base, each of the pixel units comprises a thin film transistor and an organic light emitting diode, the fingerprint identification substrate comprises a second base and a plurality of fingerprint identification devices provided on the second base, the fingerprint identification substrate is located at a side of the first base distal to the pixel units, the array substrate further comprises a light blocking layer and a via-hole provided between at least a portion of the pixel units adjacent to each other, the via-hole is formed in the light blocking layer so that light emitted by the organic light emitting diode is reflected by a surface of a touch terminal to irradiate onto more than one of the fingerprint identification devices, the surface of the touch terminal comprises ridges and valleys, light reflected by the ridges and the valleys of the surface of the touch terminal passes through the via-hole to irradiate onto different ones of the fingerprint identification devices respectively.

In some embodiments, a plurality of via-holes are provided in the light blocking layer, a pitch between any adjacent via-holes is equal to one to two times an image distance, and the image distance is a vertical distance from an end of each via-hole proximal to the fingerprint identification devices to a layer where the fingerprint identification devices are located.

In some embodiments, each of the fingerprint identification devices is provided with a micro lens thereon.

In some embodiments, each of the fingerprint identification devices is a photosensitive device.

In some embodiments, the light blocking layer comprises a material of metal or black resin.

In some embodiments, a gate of the thin film transistor is further formed in the light blocking layer.

In some embodiments, an aperture of the via-hole is within a range from 1 μm to 100 μm.

In some embodiments, the first base comprises a material of polyimide.

In some embodiments, the second base comprises a material of polyimide.

In some embodiments, the touch panel further comprises an opposite substrate located at a side of the first base provided with the pixel units.

Another technical solution of the present application is a display apparatus comprising the touch panel described above.

DETAILED DESCRIPTION OF THE EMBODIMENTS

In order to make a person skilled in the art understand technical solutions of the present application better, the present application will be described in detail below in conjunction with accompanying drawings and embodiments.

First Embodiment

Figure 1:
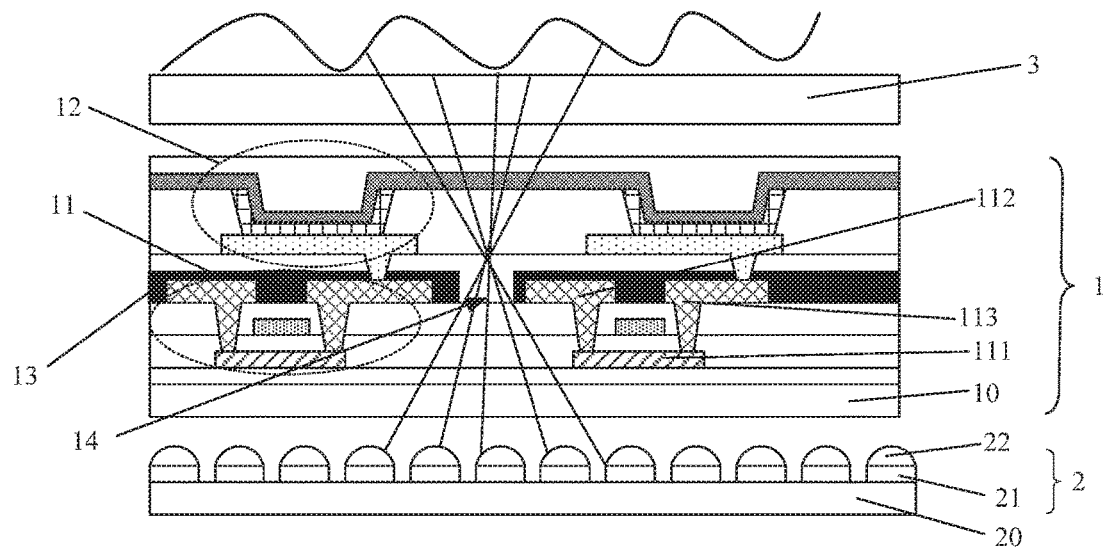
FIG. 1 shows a structural diagram of a touch panel in accordance with a first embodiment of the present application.

Referring to FIG. 1, the present embodiment provides a touch panel with a fingerprint identification function. The touch panel comprises an array substrate 1 and a fingerprint identification substrate 2. The array substrate 1 comprises a first base 10 and a plurality of pixels units provided on the first base 10, and each of the pixel units comprises a thin film transistor 11 and an organic light emitting diode 12. The fingerprint identification substrate 2 comprises a second base 20 and a plurality of fingerprint identification devices 21 provided on the second base 20. The fingerprint identification substrate 2 is provided at a side of the first base 10 distal to the pixel units. Particularly, the array substrate 1 of the present embodiment further comprises a light blocking layer 13 and a via-hole 14 provided between at least a portion of the pixel units adjacent to each other, the via-hole 14 is formed in the light blocking layer 13, so that light emitted by the organic light emitting diode 12 is reflected by a surface of a touch terminal to irradiate onto more than one of the fingerprint identification devices 21, wherein, the surface of the touch terminal comprises ridges and valleys, light reflected by the ridges and the valleys of the surface of the touch terminal passes through the via-hole 14 to irradiate onto different ones of the fingerprint identification devices 21 respectively.

In the present embodiment, the touch terminal may be any object capable of touching, which has a surface with ridges and valleys, such as fingers and toes. In the present embodiment, descriptions are given by taking the touch terminal being a finger as an example. In the touch panel of the present embodiment, the fingerprint identification substrate 2 is provided at a side of the organic light emitting diode (OLED) array substrate 1 distal to a display surface, and the via-hole 14 is provided between at least a portion of the pixel units adjacent to each other in the array substrate 1, the via-hole 14 meets a principle of pinhole imaging, so that light emitted by the organic light emitting diode 12 is reflected by ridges and valleys of the finger surface to irradiate onto more than one of the fingerprint identification devices 21, and light reflected by the ridges and the valleys of the finger surface irradiates onto different ones of the fingerprint identification devices 21. In this case, the ridges and the valleys of the finger surface may be identified by analyzing intensity of light reflected by the ridges and the valleys of the finger surface. Moreover, light reflected by others except the finger surface is blocked by the light blocking layer 13 and cannot pass through the via-hole 14, that is to say, light emitted through the via-hole 14 is only the light reflected by the finger surface, in this case, fingerprint information received by the fingerprint identification devices 21 is more precise, which is advantageous to identification of the ridges and the valleys of the finger surface. Certainly, it should be understood that, the light blocking layer 13 is provided without affecting an aperture ratio of the touch panel.

In the present embodiment, a plurality of via-holes 14 may be provided in the light blocking layer 13, a pitch between any adjacent via-holes 14 is equal to one to two times an image distance, and the image distance is a vertical distance from a bottom of each via-hole 14 (i.e., an end of each via-hole 14 proximal to the fingerprint identification devices 21) to a layer where the fingerprint identification devices 21 are located. That is to say, multiple pixel units may be provided between any adjacent via-holes 14, because if the via-holes 14 are provided with a too large density, light emitted through adjacent via-holes 14 may irradiate onto a same fingerprint identification device 21, resulting in signal crosstalk, thus identification of ridges and valleys of the finger surface may be inaccurate.

Figure 3:
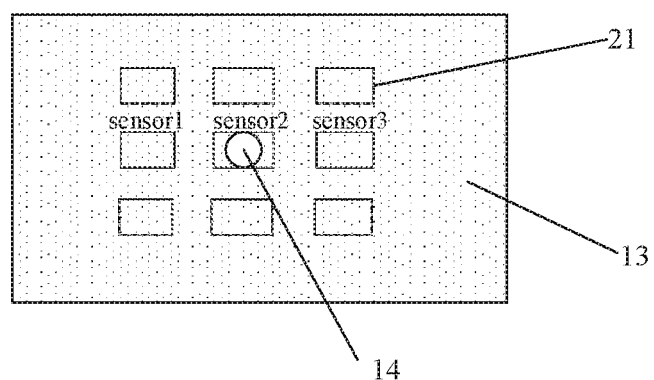
FIG. 3 shows a diagram of a via-hole corresponding to more than one fingerprint identification devices in the touch panel in accordance with the first embodiment of the present application.
Figure 4:
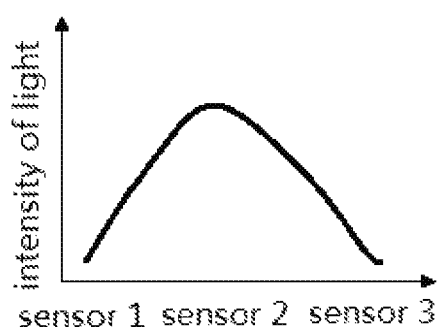
FIG. 4 shows a diagram of intensity distribution of light passing through the via-hole as shown in FIG. 3 and reaching different ones of the fingerprint identification devices.
Figure 5:
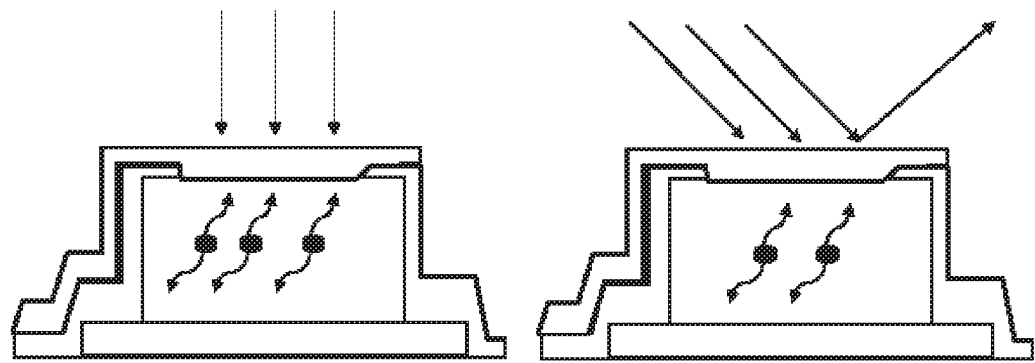
FIG. 5 shows a diagram of distribution of light irradiating and reaching the fingerprint identification devices at different angles.
Figure 6:
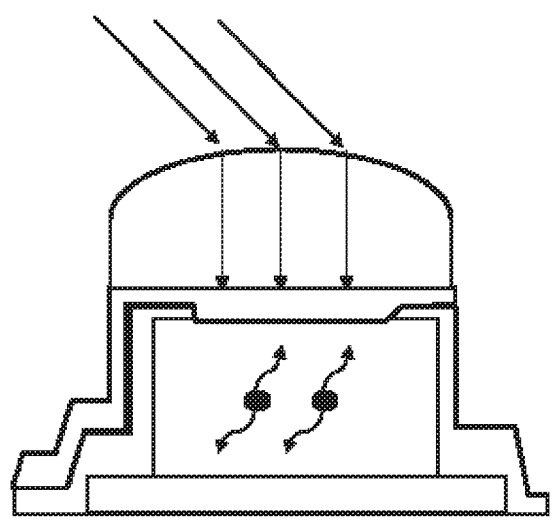
FIG. 6 shows a diagram of distribution of light irradiating and reaching the fingerprint identification devices provided with micro lenses thereon at different angles.

Light emitted by the organic light emitting diode 12 after being reflected by the finger surface penetrates through layers of the array substrate 1, and an air layer between the array substrate 1 and the fingerprint identification substrate 2 to reach the fingerprint identification devices 21, thus intensity thereof is reduced when it reaches the fingerprint identification devices 21. Meanwhile, due to different incident angles of the light, different incident interfaces of the light are generated. In a case where intensities are approximate to each other, different reflections and absorptions are generated when the light at different incident angles pass through different incident interfaces. As shown in FIGS. 3 and 4, the intensity of the light received by the intermediate fingerprint identification device 21 (e.g., sensor 2) corresponding to the via-hole 14 is largest, but with increasing of an angle between an incident light and a normal line of the touch panel, other fingerprint identification devices 21 receive light with different intensities (for example, the intensities of the light received by the sensor 1 and the sensor 3 are smaller than that of the light received by the sensor 2), and in this case, while identifying ridges and valleys of the finger surface by analyzing difference between intensities of light received by the fingerprint identification devices 21, the ridge and the valley may be confused. Particularly, in a case where the fingerprint identification device 21 in the present embodiment is a photosensitive device (e.g., PIN device), as shown in FIG. 5, the light vertically irradiating the touch panel will enter the PIN device, a photon will produce an electron hole pair, however, due to refractive index of film at surface of the PIN device, a portion of light irradiating onto the PIN device at a certain angle with respect to the normal line of the touch panel will be reflected or refracted when it reaches the surface of the PIN device, resulting in a lowered conversion efficiency of light, thus the PIN device right under the via-hole 14 generates a relatively large current, and the PIN device deviating from the right underneath of the via-hole 14 generates a relatively small current, and in this case, while identifying ridges and valleys of the finger surface by analyzing difference between intensities of light received by the fingerprint identification devices 21, the ridge and the valley may be confused. Therefore, in the present embodiment, each fingerprint identification device 21 may be provided with a micro lens 22 thereon, and in this case, as shown in FIG. 6, light incident to the micro lens 22 at different angles vertically irradiate onto the fingerprint identification devices 21 so that the intensity of the light received by the fingerprint identification devices 21 are not affected by the incident angles thereof, the intensities of the light received by the fingerprint identification devices 21 are more closer to those of the light emitted by the organic light emitting diode after being reflected by the finger surface, and meanwhile, the light passing through the via-hole 14 more uniformly irradiates onto the corresponding fingerprint identification devices 21, which is more advantageous to identification of ridges and valleys of fingerprint.

In the present embodiment, the light blocking layer 13 comprises a material of metal or black resin, and certainly may comprise other light blocking materials.

As shown in FIG. 1, the light blocking layer 13 may further comprise a source 112 and a drain 113 of the thin film transistor 11, that is to say, the via-hoe 14 may be provided in a layer the same as that of the source 112 and the drain 113 of the thin film transistor 11, thus the via-hole 14, the source 112 and the drain 113 of the thin film transistor 11 may be formed by a single patterning process.

Figure 2:
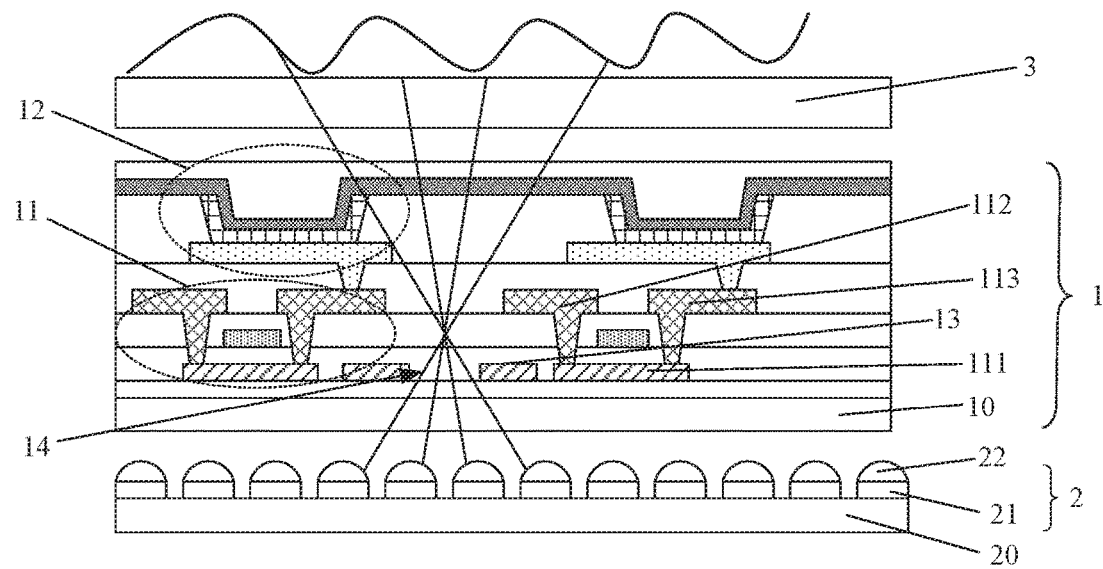
FIG. 2 shows a structural diagram of a light blocking layer comprising a gate of a thin film transistor in the touch panel in accordance with the first embodiment of the present application.

As shown in FIG. 2, the light blocking layer 13 may further comprise a gate 111 of the thin film transistor 11, that is to say, the via-hole 14 may be provided in a layer the same as that of the gate of the thin film transistor 11, thus the via-hole 14 and the gate 111 of the thin film transistor 11 may be formed by a single patterning process. Certainly, the light blocking layer 13 with the via-hole 14 may be additionally provided between any two film layers of the array substrate 1.

The via-hole 14 in the present embodiment generally has a dimension within a range from 1 μm to 100 μm, for example, in the order of several microns. The pitch between adjacent via-holes 14 may be relatively large, for example, in the order of several millimeters, in such way, after the fingerprint identification substrate 2 and the array substrate 1 are aligned and combined together, light emitted through each via-hole 14 can irradiate onto more than one of the fingerprint identification devices 21. Certainly, the aperture of the via-hole 14 may also be determined in accordance with the dimension of the fingerprint identification device 21.

Both the first base 10 of the array substrate 1 and the second base 20 of the fingerprint identification substrate 2 in the present embodiment may comprise a material of polyimide (PI), and may also comprise other conventional materials.

Certainly, the touch panel in the present embodiment further comprises an opposite substrate 3 located at a side of the first base 10 provided with the pixel units.

Second Embodiment

The present embodiment provides a display apparatus comprising the touch panel in the first embodiment.

The display apparatus of the present embodiment can more precisely identify fingerprint due to employing the touch panel of the first embodiment.

The display apparatus of the present embodiment may be any product or member having a display function, such as an electronic paper, a mobile phone, a tablet computer, a television, a display, a notebook computer, a digital photo frame, a navigator and so on.

In the touch panel of the present application, the fingerprint identification substrate is provided at a side of the array substrate distal to a display surface, and the via-hole is provided between at least a portion of the pixel units adjacent to each other, the via-hole meets a principle of pinhole imaging, so that light emitted by the organic light emitting diode is reflected by a surface of a touch terminal to irradiate onto more than one of the fingerprint identification devices, and light reflected by the ridges and the valleys of the surface of the touch terminal irradiates onto different ones of the fingerprint identification devices respectively, thus the ridges and the valleys may be identified by analyzing intensity of light received by the fingerprint identification devices. Moreover, light reflected by others except the surface of the touch terminal is blocked by the light blocking layer and cannot pass through the via-hole, that is to say, light emitted through the via-hole is only the light reflected by the surface of the touch terminal, in this case, fingerprint information received by the fingerprint identification devices is more precise, which is advantageous to identification of the ridges and the valleys of the surface of the touch terminal.

It should be understood that, the above embodiments are merely exemplary embodiments for explaining principle of the present invention, but the present invention is not limited thereto. Various modifications and improvements may be made by those ordinary skilled in the art within the spirit and essence of the present invention, these modifications and improvements fall into the protection scope of the present invention.

The invention claimed is:

1. A touch panel, comprising an array substrate and a fingerprint identification substrate, wherein the array substrate comprises a first base and a plurality of pixel units provided on the first base, each of the pixel units comprises a thin film transistor and an organic light emitting diode, the fingerprint identification substrate comprises a second base and a plurality of fingerprint identification devices provided on the second base, the fingerprint identification substrate is located at a side of the first base distal to the pixel units, the array substrate further comprises a light blocking layer and a via-hole provided between at least a portion of the pixel units adjacent to each other, the via-hole is formed in the light blocking layer so that light emitted by the organic light emitting diode is reflected by a surface of a touch terminal to irradiate onto more than one of the fingerprint identification devices, the surface of the touch terminal comprises ridges and valleys, light reflected by the ridges and the valleys of the surface of the touch terminal passes through the via-hole to irradiate onto different ones of the fingerprint identification devices respectively.

2. The touch panel of claim 1, wherein a plurality of via-holes are provided in the light blocking layer, a pitch between any adjacent via-holes is equal to one to two times an image distance, and the image distance is a vertical distance from an end of each via-hole proximal to the fingerprint identification devices to a layer where the fingerprint identification devices are located.

3. The touch panel of claim 1, wherein each of the fingerprint identification devices is provided with a micro lens thereon.

4. The touch panel of claim 1, wherein each of the fingerprint identification devices is a photosensitive device.

5. The touch panel of claim 1, wherein the light blocking layer comprises a material of metal or black resin.

6. The touch panel of claim 1, wherein a gate of the thin film transistor is further formed in the light blocking layer.

7. The touch panel of claim 1, wherein an aperture of the via-hole is within a range from 1 μm to 100 μm.

8. The touch panel of claim 1, wherein the first base comprises a material of polyimide.

9. The touch panel of claim 1, wherein the second base comprises a material of polyimide.

10. The touch panel of claim 1, further comprising an opposite substrate located at a side of the first base provided with the pixel units.

11. A display apparatus, comprising the touch panel of claim 1.

* * * * *